United States Patent
Kraft et al.

(10) Patent No.: US 8,744,791 B1
(45) Date of Patent: Jun. 3, 2014

(54) AUTOMATIC GENERATION AND ANALYSIS OF SOLAR CELL IV CURVES

(75) Inventors: Steven M Kraft, Berkeley, CA (US); Jason C. Jones, Berkeley, CA (US)

(73) Assignee: SunPower Corporation, San Jose, CA (US)

( * ) Notice: Subject to any disclaimer, the term of this patent is extended or adjusted under 35 U.S.C. 154(b) by 305 days.

(21) Appl. No.: 13/053,770

(22) Filed: Mar. 22, 2011

(51) Int. Cl.
*G01R 25/00* (2006.01)

(52) U.S. Cl.
USPC .......................................... 702/65; 250/212

(58) Field of Classification Search
USPC .................................. 702/65, 28, 79
See application file for complete search history.

(56) References Cited

U.S. PATENT DOCUMENTS

| | | | | |
|---|---|---|---|---|
| 7,605,498 B2 * | 10/2009 | Ledenev et al. | | 307/80 |
| 7,719,140 B2 * | 5/2010 | Ledenev et al. | | 307/80 |
| 8,289,183 B1 * | 10/2012 | Foss | | 340/870.02 |
| 2008/0143188 A1 * | 6/2008 | Adest et al. | | 307/82 |
| 2008/0147335 A1 * | 6/2008 | Adest et al. | | 702/64 |
| 2012/0215372 A1 * | 8/2012 | Kernahan et al. | | 700/298 |
| 2012/0242320 A1 * | 9/2012 | Fischer et al. | | 324/72 |
| 2012/0253541 A1 * | 10/2012 | Arditi et al. | | 700/298 |
| 2012/0255591 A1 * | 10/2012 | Arditi et al. | | 136/244 |
| 2012/0268087 A1 * | 10/2012 | Kernahan | | 323/234 |
| 2013/0026843 A1 * | 1/2013 | Arditi et al. | | 307/82 |

OTHER PUBLICATIONS

Portable I-V Testers for PV Modules, 1 sheet [retrieved on Jan. 10, 2011], retrieved from the internet: http://www.pvmeasurements.com/products/i-v-testing-system/portable-i-v-testers-for-modules.
Brian P. Dougherty, et al. "Measured Performance of Building Integrated Photovoltaic Panels—Round 2", pp. 1-10 [retrieved on Jan. 11, 2011], retrieved from the internet: http://www.bfrl.nist.gov/863/bipv/documents/ASME_Final.pdf.
Sunpower TMAC—Advanced Tracker Controller, 2 sheets, webpage [online], retrieved from the internet on Jan. 11, 2011, sunpowercorp.com.
Sunpower E19 / 238 Solar Panel—Maximum Efficiency and Performance, 2 sheets, webpage [online], retrieved from the internet on Jan. 11, 2011, sunpowercorp.com.
A. Hunter Fanney, et al. "Measured Performance of Building Integrated Photovoltaic Panels", Aug. 2001, pp. 187-193, vol. 123, Journal of Solar Energy Engineering, copyright 2001 by ASME.

* cited by examiner

*Primary Examiner* — Sujoy Kundu
*Assistant Examiner* — Alvaro Fortich
(74) *Attorney, Agent, or Firm* — Okamoto & Benedicto LLP (57) ABSTRACT

A photovoltaic system includes multiple strings of solar panels and a device presenting a DC load to the strings of solar panels. Output currents of the strings of solar panels may be sensed and provided to a computer that generates current-voltage (IV) curves of the strings of solar panels. Output voltages of the string of solar panels may be sensed at the string or at the device presenting the DC load. The DC load may be varied. Output currents of the strings of solar panels responsive to the variation of the DC load are sensed to generate IV curves of the strings of solar panels. IV curves may be compared and analyzed to evaluate performance of and detect problems with a string of solar panels.

20 Claims, 9 Drawing Sheets

AUTOMATIC GENERATION AND ANALYSIS OF SOLAR CELL IV CURVES

STATEMENT REGARDING FEDERALLY SPONSORED RESEARCH OR DEVELOPMENT

The invention described herein was made with Governmental support under contract number DE-FC36-07G017043 awarded by the United States Department of Energy. The Government may have certain rights in the invention.

TECHNICAL FIELD

Embodiments of the subject matter described herein relate generally to solar cells. More particularly, embodiments of the subject matter relate to generation and analysis of solar cell current-voltage (IV) curves.

BACKGROUND

Solar cells, also known as "photovoltaic cells," are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Figure 1:
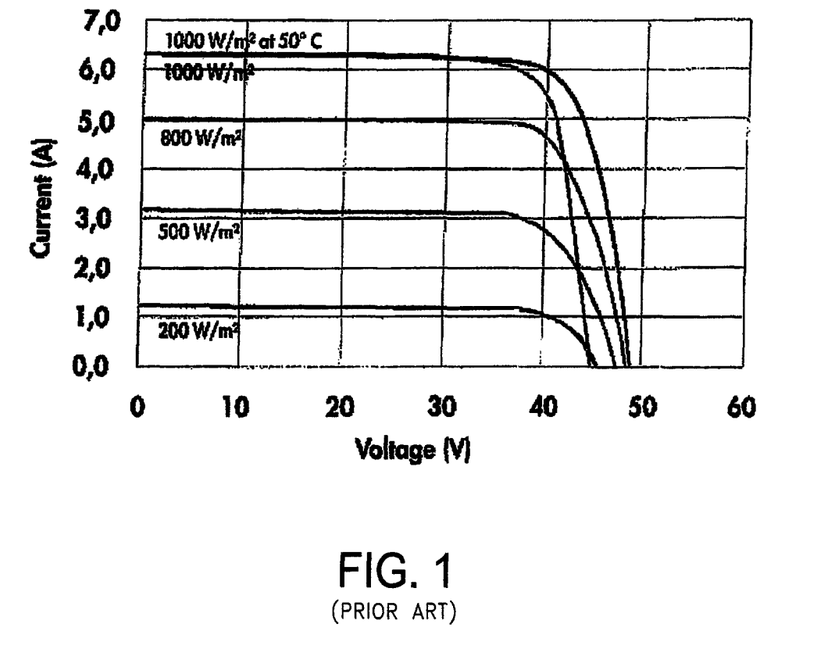
FIG. 1 schematically shows example IV curves of a solar panel.

A solar cell may be characterized by its IV curve, which is a plot of the solar cell's output current for a given output voltage. The IV curve is indicative of the performance of the solar cell. FIG. 1 shows example IV curves of a solar panel, which comprises a plurality of interconnected solar cells mounted on the same frame. The IV curves of FIG. 1 show current-voltage characteristics with dependence on solar insolation and temperature of the solar panel.

Solar cell IV curves of a solar panel may be manually generated by technicians using appropriate test equipment. Typically, a technician may measure output current and voltage of a solar panel to get IV curves for the solar panel for that particular time of day. To generate IV curves for a new solar installation, which may comprise hundreds of solar panels, several technicians are needed for several days. After installation, new IV curves for the solar installation may need to be periodically generated to verify the performance of the solar panels in accordance with contractual obligations. The new IV curves are again manually generated by technicians.

BRIEF SUMMARY

In one embodiment, a method of automatically generating and analyzing solar cell current-voltage (IV) curves includes sensing current generated by a string of solar panels in a plurality of strings of solar panels, each string of solar panels in the plurality of strings of solar panels comprising a plurality of serially-connected solar panels, each solar panel in the plurality of serially-connected solar panels comprising a plurality of serially-connected solar cells mounted on a same frame. Voltage generated by the string of solar panels is sensed. An IV curve of the string of solar panels is automatically generated based on sensed current and voltage.

In another embodiment, a photovoltaic system comprises a plurality of strings of solar panels, each string of solar panels in the plurality of strings of solar panels comprising a plurality of serially-connected solar panels, each solar panel in the plurality of serially-connected solar panels comprising a plurality of serially-connected solar cells mounted on a same frame. Each string of solar panels in the plurality of solar panels includes a current sensor circuit configured to sense output current of the string of solar panels. A computer is configured to receive sensor data from the sensor circuit in each string of solar panels, and to generate an IV curve of a string of solar panels in the plurality of strings of solar panels, the IV curve indicating output voltage versus output current of the string of solar panels.

In another embodiment, a method of automatically generating and analyzing solar cell IV curves includes controlling a device to vary a DC load presented to a plurality of strings of solar panels. Current generated by a string of solar panels in the plurality of strings of solar panels responsive to the variation of the DC load is sensed. An IV curve of the string of solar panels is automatically generated based on current generated by the string of solar panels responsive to the variation of the DC load.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Techniques and technologies may be described herein in terms of functional and/or logical block components and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

Figure 7:
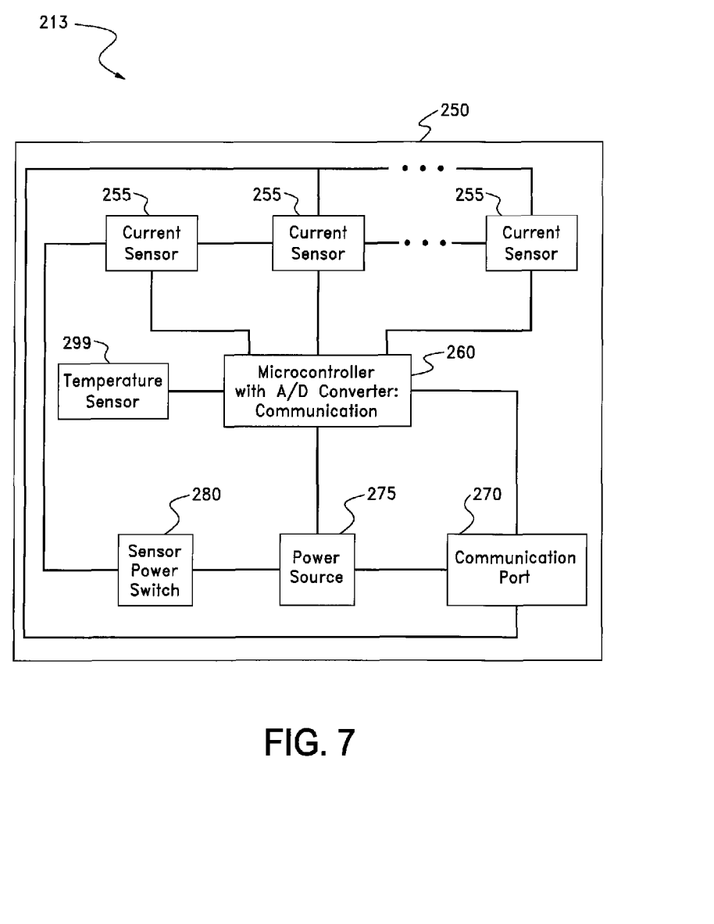
FIG. 7 schematically shows a diagram of a string current monitor block in accordance with an embodiment of the present invention.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 7 depicts one exemplary arrangement of elements, additional intervening elements, devices, features, or components may be present in an embodiment of the depicted subject matter.

Figure 2:
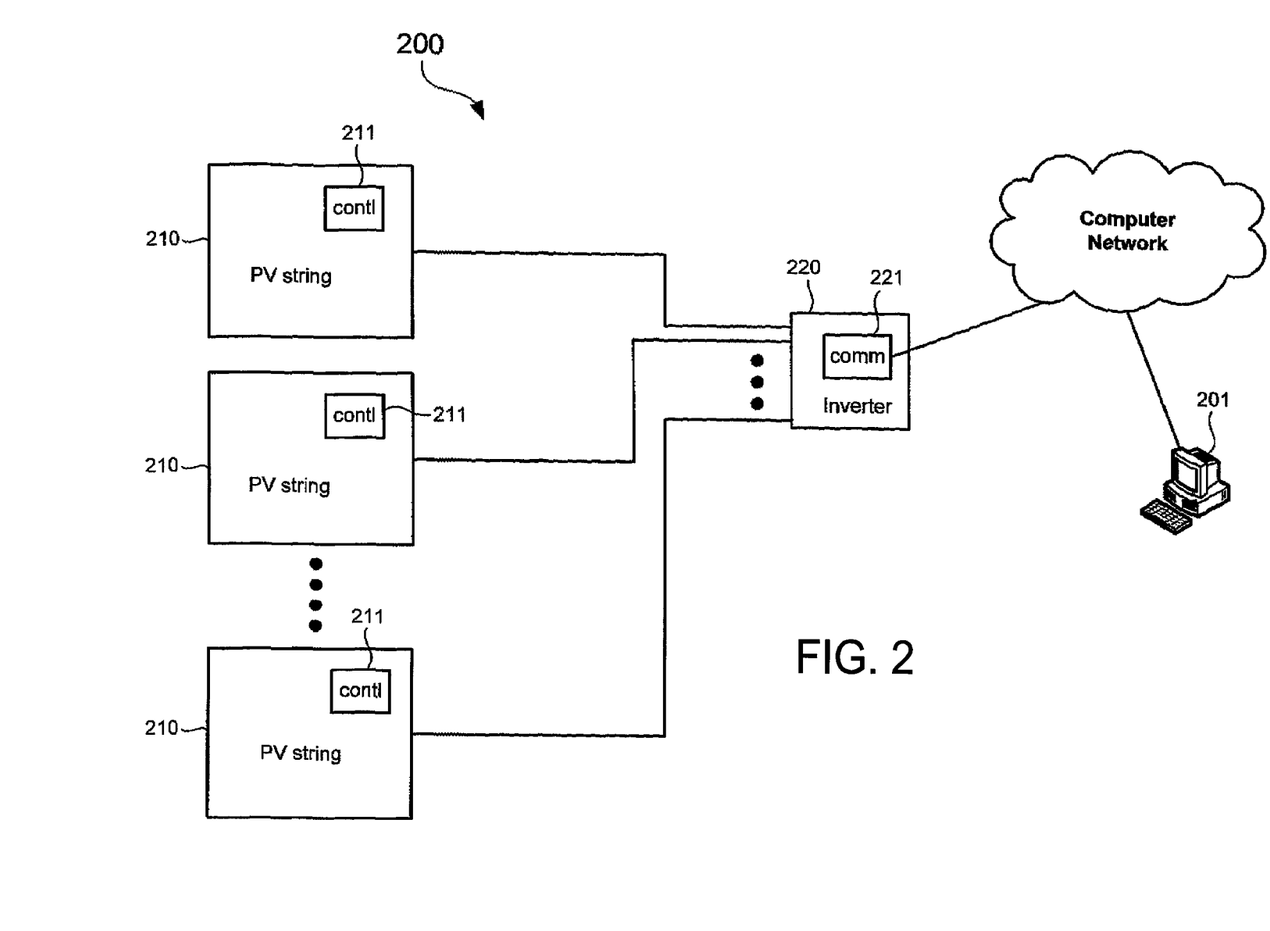
FIG. 2 schematically shows a photovoltaic (PV) system in accordance with an embodiment of the present invention.

FIG. 2 schematically shows a photovoltaic (PV) system 200 in accordance with an embodiment of the present invention. In the example of FIG. 2, the PV system 200 includes a plurality of PV strings 210, a PV inverter 220, and a data collection and control computer 201.

A PV string 210 may comprise a plurality of solar panels that are electrically connected in series. The direct current (DC) output of the PV string 210 is electrically coupled to a device that presents a DC load to the PV strings 210. In the example of FIG. 2, that device is the PV inverter 220, which converts the DC output of the PV strings 210 to sinusoidal alternating current (AC). The AC output of the PV inverter 220 may be applied to a power grid or power distribution of a customer structure (e.g., residential, commercial, industrial), for example. A PV string 210 may include a controller 211 configured to monitor and control solar panels in the string and to communicate with other components of the PV system 200. In one embodiment, a PV string 210 wirelessly communicates with the PV inverter 220 over a wireless mesh network. A PV string 210 may also communicate with the PV inverter 220 over other types of communications networks without detracting from the merits of the present invention.

The computer 201 may comprise a computer configured to collect operational data from the PV system 200 including electrical current, voltage, temperature, solar insolation, and other information indicative of the performance and operational status of the PV system 200. The PV inverter 220 may include a communications module 221 for communicating with components of the PV system 200, including combiner boxes 212 (see FIG. 3), controllers 211, and the computer 201. The PV inverter 220 may communicate with the computer 201, combiner boxes 212, controllers 211, and other components of the PV system 200 over a wired or wireless computer network, which includes the Internet.

Figure 3:
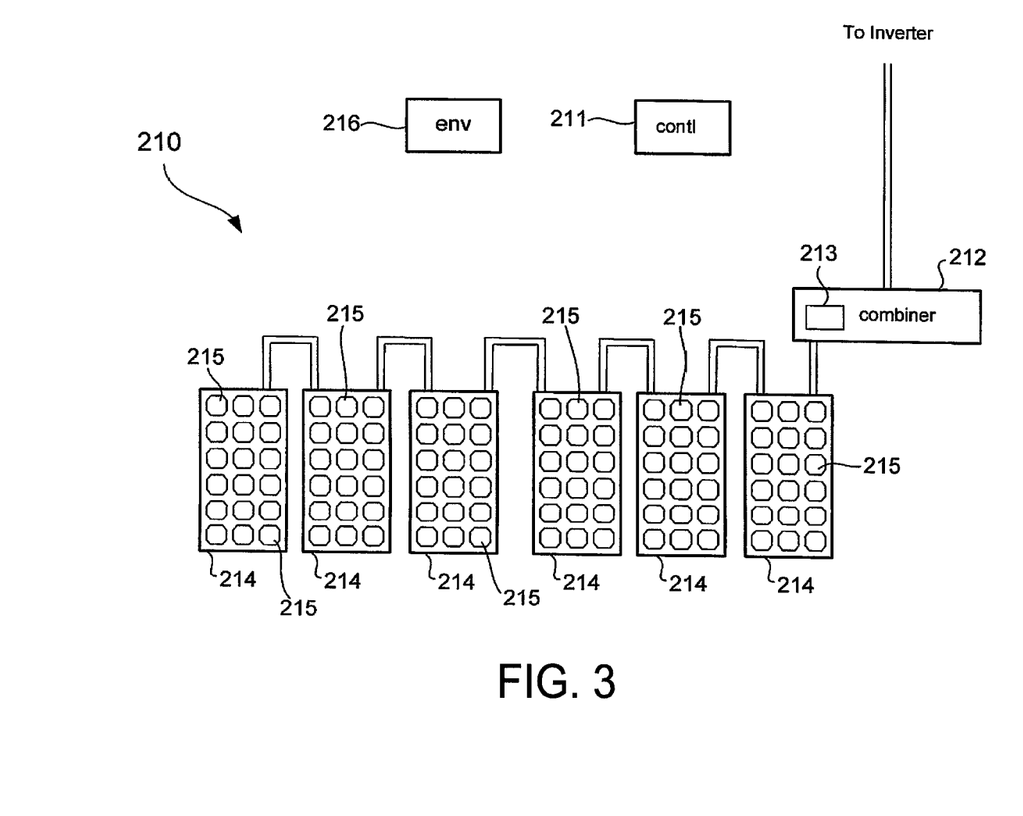
FIG. 3 schematically shows a PV string in the PV system of FIG. 2, in accordance with an embodiment of the present invention.

FIG. 3 schematically shows a PV string 210 in accordance with an embodiment of the present invention. In the example of FIG. 3, the PV string 210 includes a combiner box 212 and a plurality of solar panels 214. A controller 211 and environment sensors 216 allow for monitoring and control of the PV string 210.

A solar panel 214 comprises electrically connected solar cells mounted on the same frame. In one embodiment, each solar panel 214 comprises a plurality of serially-connected backside contact solar cells 215. Only some of the backside contact solar cells 215 have been labeled in FIG. 3 for clarity of illustration. Other types of solar cells, such as front contact solar cells, may also be employed.

Each PV string 210 comprises a plurality of serially-connected solar panels 214 coupled to a combiner box 212. The output of the PV string 210 is electrically connected to the PV inverter 220 by way of the combiner box 212. The output voltage of the PV string 210 may thus be sensed by a voltage sensing circuit at the PV inverter 220.

In the example of FIG. 3, the combiner box 212 includes sensor circuits 213. The sensor circuits 213 may comprise electrical circuits for sensing the amount of electrical current flowing through the solar panels 214 of the PV string 210 (and hence the output current of the PV string 210) and for sensing the output voltage of the PV string 210. The sensor circuits 213 may be implemented using conventional current and voltage sensing circuits. The sensor circuits 213 may be located in the combiner box 212 or integrated with a solar panel 214. The sensor circuits 213 may transmit current and voltage readings to the controller 211 of the PV string 210 over a wired or wireless connection. In another embodiment, the output voltage of a PV string 210 is directly sensed at the PV inverter 220.

The environment sensors 216 may comprise an irradiance sensor and/or temperature sensor. The environment sensors 216 are shown collectively as outside the solar panels 214. In practice, an environment sensor 216 may be located in individual solar panels 214 or a location representing the PV string 210.

An irradiance sensor senses the amount of solar irradiance of insolation on one or more solar panels 214. The irradiance sensor may comprise a plurality of solar cells separate from those of the solar panels 214. The output current of the irradiance sensor solar cells is indicative of the amount of solar insolation on the panel, and is sensed by an associated electrical circuit and provided to the controller 211. An irradiance sensor may be mounted on individual solar panels 214 or a location representative of the location of the PV string 210.

The environment sensors 216 may also comprise a temperature sensor. The output of the temperature sensor is indicative of the temperature of a solar panel 214 or a location of the of the PV string 210 where the temperature sensor is located. The output of the temperature sensor may be provided to the controller 211.

The controller 211 may comprise control circuits, such as a maximum power point optimizer, and communication circuits for sending and receiving data between components of the PV string 210 and the PV system 200 in general. The controller 211 may receive sensor outputs from the sensor circuits 213 and environment sensors 216 over a wired or wireless connection. The controller 211 is configured to communicate the sensor outputs to the communications module 221 of the PV inverter 220, which provides the sensor outputs to the computer 201.

Figure 4:
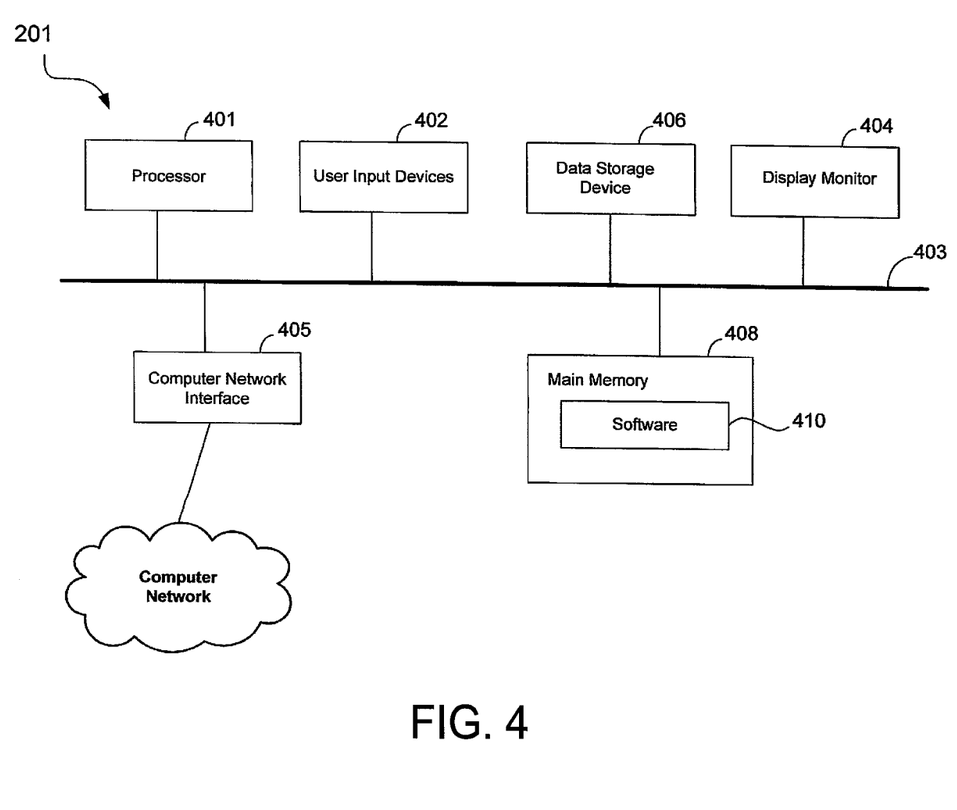
FIG. 4 schematically shows a data collection and control computer in the PV system of FIG. 2, in accordance with an embodiment of the present invention.

FIG. 4 schematically shows a data collection and control computer 201 in accordance with an embodiment of the present invention. The computer 201 may have less or more components to meet the needs of a particular application. The computer 201 may include a processor 401, such as those from the Intel Corporation or Advanced Micro Devices, for example. The computer 201 may have one or more buses 403 coupling its various components. The computer 201 may include one or more user input devices 402 (e.g., keyboard, mouse), one or more data storage devices 406 (e.g., hard drive, optical disk, USB memory), a display monitor 404 (e.g., LCD, flat panel monitor, CRT), a computer network interface 405 (e.g., network adapter, modem), and a main memory 408 (e.g., RAM). The computer network interface 405 may be coupled to a computer network, which in this example includes the Internet.

The computer 201 is a particular machine as programmed with software components 410 to perform its function. The software components 410 comprise computer-readable program code stored non-transitory in the main memory 408 for execution by the processor 401. The software components 410 may be loaded from the data storage device 406 to the main memory 408. The software components 410 may also be made available in other computer-readable medium including optical disk, flash drive, and other memory device. The software components 410 may include data collection and control, logging, statistics, plotting, and reporting software, In one embodiment, the computer 201 is configured to receive data from the communications module 221, controller 211, and/or other components of the PV system 200. The computer 201 may receive sensor data from the PV strings 210 directly or by way of the inverter 220. The sensor data may include output current of a PV string 210, output voltage of a PV string 210, and environmental conditions (e.g., temperature, solar insolation) of a PV string 210.

The computer 201 may be configured to control the DC load presented to the PV strings 210. For example, the computer 201 may be configured to send a control signal to the inverter 220 such that the inverter 220 presents a particular DC load to the PV strings 210. A PV string 210 changes its output current based on to the DC load presented to it. By varying the DC load presented by the inverter 220, and receiving data indicating the corresponding output current and voltage generated by the PV string 210 for particular DC loads, the computer 201 is able to plot IV curves for the PV string 210 under various conditions and for different output current and voltage levels.

Figure 5:
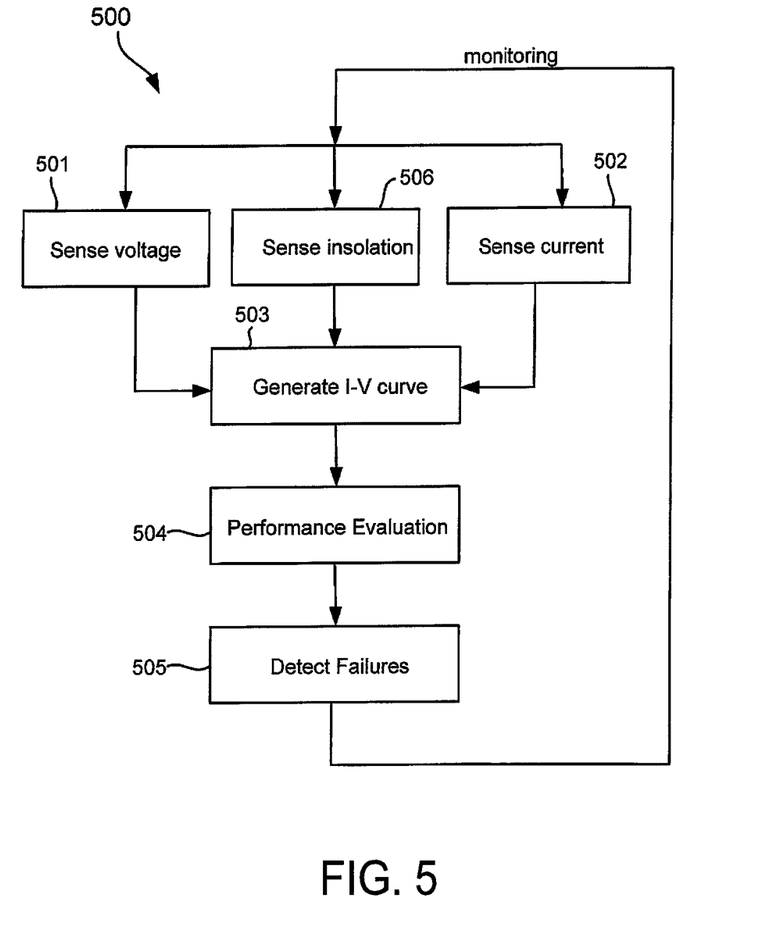
FIG. 5 shows a flow diagram of a method of automatic generation and analysis of solar cell IV curves in accordance with an embodiment of the present invention.

FIG. 5 shows a flow diagram of a method 500 of automatic generation and analysis of solar cell IV curves in accordance with an embodiment of the present invention. The method 500 is explained using the PV system 200 as an example. As can be appreciated, the method 500 may also be employed in other solar cell installations with a relatively large number of solar panels. The steps of the method 500 may be repeatedly performed to allow for real-time monitoring of the PV system 200.

The method 500 includes sensing the output voltage (step 501) and corresponding output current (step 502) and insolation (step 506) of a PV string 210 in the PV system 200. The output current of the PV string 210 may be sensed by a current sensing circuit installed in a combiner box 212 or integrated in a solar panel 214. Similarly, the output voltage of the PV string 210 may be sensed by a voltage sensing circuit installed in the combiner box 212 or integrated in a solar panel 214. The output voltage of the PV string 210 may also be sensed at the PV inverter 220. Various output voltage-current pairs may be sensed over a relatively long period of time, or by varying the DC load presented to the PV string 210. Each current and voltage measurement may include solar insolation for that measurement.

The sensor data indicating the sensed output voltage, current, and solar insolation of the PV string 210 may be received by a controller 211 in the PV string 210, and then transmitted to the computer 201 directly or by way of the PV inverter 220. Sensor data for a particular PV string 210 may be collected periodically in real-time, such as every few minutes. The sensor data may include additional information, such as time and date stamps indicating when the output voltage and current were sensed and environmental conditions (e.g., solar insolation and temperature) at the time the output voltage and current were sensed.

The computer 201 may periodically receive sensor data of each of the plurality of PV strings 210. The computer 201 may generate IV curves for each PV string 210 using the sensor data (step 503). The IV curves may indicate output voltages, corresponding currents for particular PV strings 210, and dependence factors, such as corresponding solar insolation and/or temperature of the PV strings 210. As a particular example, each IV curve for a particular PV string 210 may indicate current and voltage at a solar insolation. The IV curves may be generated for sensor data taken over a period of time, such as over a week, month, or year. The sensor data for generating IV curves may be filtered based on collected solar insolation and/or temperature data. For example, the sensor data may be filtered such that only sensor data taken at particular solar insolation and/or temperature are used to generate IV curves.

In one embodiment, IV curves generated from sensor data are employed to evaluate the performance of a PV string 210 in real-time (step 504). For example, the computer 201 may compare an IV curve having recent current-voltage data against a baseline IV curve or a reference IV curve to determine if the PV string 210 meets performance standards. The baseline IV curve may be the IV curve of the PV string 210 as originally installed and the reference IV curve may be dictated by contractual requirements. The IV curve comparison may indicate whether the PV string 210 is degrading, e.g., lower output current at a particular output voltage, or still meets expected performance standards. Automatically sensing output voltages, output currents, and corresponding environmental conditions, and then automatically generating corresponding IV curves advantageously allow for evaluation of the performance of the PV string 210 in real-time. By comparing recent and past IV curves of the PV string 210, performance degradation trends may be detected before the degradation becomes a full blown failure.

In one embodiment, IV curves generated from sensor data are employed to detect and troubleshoot PV string failures (step 505). For example, the computer 201 may analyze a recent IV curve to detect a present or pending open circuit or short circuit condition. A short circuit condition is characterized by an IV curve where an output voltage is low for a corresponding high output current. A short circuit condition indicates that there is a short in the PV string 210 (e.g., a solar panel 214 is shorted or developing a short). An open circuit condition is characterized by an IV curve where an output voltage is high for a corresponding low output current. An open circuit condition indicates that the series connection of the solar panels 214 in the string is open. The threshold for low or high current or voltage may be set for particular installations. The computer 201 may compare current-voltage pairs of an IV curve to thresholds to determine if the PV string 210 presently or will soon have a short circuit condition or open circuit condition.

Figure 6:
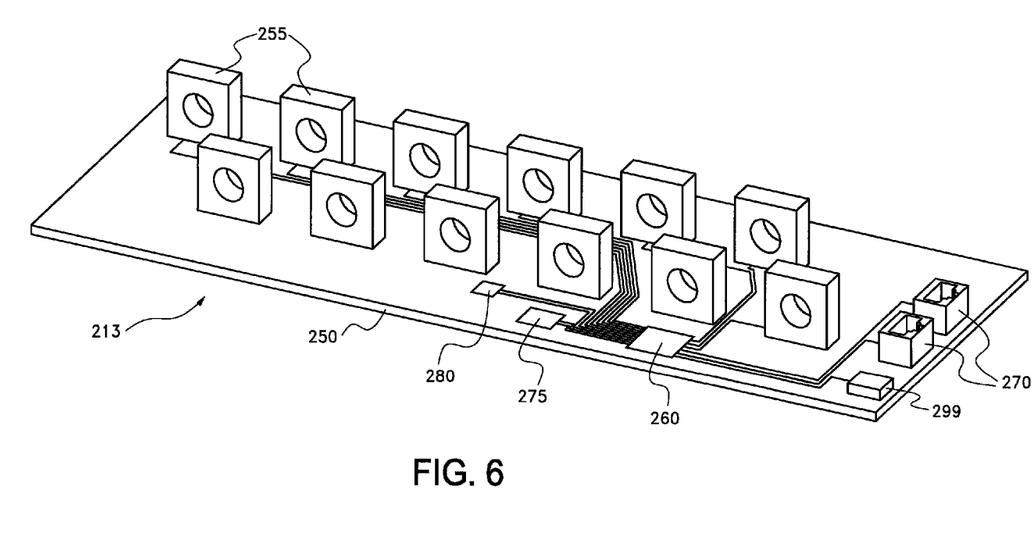
FIG. 6 schematically shows a string current monitor block in accordance with an embodiment of the present invention.

FIG. 6 illustrates an embodiment of a string current monitor block for use with PV system 200, described above. Unless otherwise described below, numerical indicators refer to similar components and elements described above. The sensor or sensor circuits 213 can include an embodiment of the string current monitor block, such as illustrated here. With additional reference to FIG. 7, the sensor 213 can include a printed circuit board (PCB) 250 supporting a plurality of current sensors 255. The current sensors 255 can be connected to or coupled to a microcontroller 260. The microcontroller 260 can also interoperate with, and the sensor 213 can also include, communication ports 270, a power source 275, and a sensor power switch 280, as well as other modules or processor devices such as a temperature sensor 299, or others not illustrated, such as memory devices, an analog-digital (A/D) converter, a translator device, an A/D converter reference, and so on. In certain embodiments, such as the illustrated embodiment of FIG. 7, one or more of such devices can be integrated, such as the microcontroller 260 which includes an A/D converter and communications module appropriate for receiving and providing signals using the communications ports 270.

The current sensors 255 can include Hall Effect field sensors adapted with sufficient sensitivity to determine current in a wire from a string of solar panels 210. There can be more than one current sensor 255 on each sensor 213, such as the twelve current sensors 255 illustrated in FIG. 6, and each current sensor 255 can be coupled to the microcontroller 260. In one embodiment, there is a current sensor 255 for each string of solar panels 210 which is connected in the combiner box 212, the sensor 213 additionally positioned within the combiner box 212. Therefore, as few as two current sensors or as many sensors as there are strings of solar panels, without limit, can be present on the sensor 213. The current sensors 255 can measure current in a wire associated with the current sensor 255 in a non-invasive manner, such as by not penetrating the wire. A Hall Effect field sensor can accomplish such a measurement.

A current sensor 255, like any of the sensors or sensing devices described herein, can provide to the microcontroller 260 any of a variety of signals, such as a voltage signal or a communications signal, which conveys information regarding the current being measured. Thus, for example, in one embodiment, the current sensor 255 can provide to the microcontroller a voltage level which is indicative of the current being measured by the current sensor 255. In such an embodiment, the voltage signal can be converted to a current measurement either by the microprocessor 260 or by another device to which the voltage level is provided. In another embodiment, the current sensor 255 can provide a signal which conveys a direct measurement of the current being measured by the current sensor 255.

Figure 8:
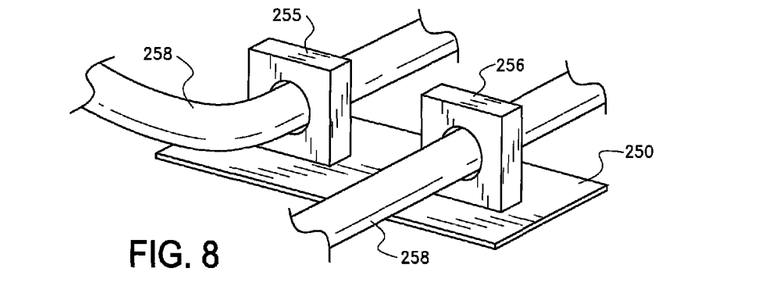
FIG. 8 schematically shows current field sensors in accordance with an embodiment of the present invention.

FIG. 8 illustrates an example of wires 258 passing through a first 255 and second 256 current sensor, where the sensors are Hall Effect field sensors. By measuring the magnetic field surrounding the wires 258, the electric current flowing through the wires 258 can be separately determined by each of the first and second current sensors 255, 256 for each of the individual wires. There is no need for a direct electrical connection to the current in the wire to measure the current.

With reference again to FIGS. 6 and 7, the microcontroller 260 is shown as a single device integrated with an A/D converter, although the functions can be performed by different devices or modules in other embodiments. The microcontroller 260 can include a processing element, as well as digital memory storage, communications devices, or other elements or devices necessary to perform the functions described herein. Although the microcontroller 260 is illustrated coupled to various different elements of the sensor 213, such as the communications ports 270 and current sensors 255, in embodiments, the different components of the sensor 213 can be interconnected and coupled together in any manner which enables practice of the functions described herein.

Thus, the microcontroller 260 can, through coupling to the communications port 270, receive signals from the controller 211, inverter 220, or other device which controls the sensor 213. The microcontroller 260 can also provide response signals through the communications port 270, therefore enabling the sensor 213 to respond to a command from a remote controlling device to energize the current sensors 255, sense the current of one or more wires passing through the current sensors 255, and send a signal communicating the measurement to the remote controlling device. Additionally, the communications port 270 can be coupled to a power source 275 of the sensor 213. The power source 275 can be controlled by the microcontroller 260 to operate the various components of the sensor 213 using power received through the communications port 270. One such communications port can be a RS-485 connector, though other ports receiving power during communication can be used. Thus, in certain embodiments, the power source 275 can be coupled to a sensor power switch 280 for providing power from the communications port 270 to each current sensor 255. In certain embodiments, the sensor 213 can be arranged such that power, including electrical power, is supplied to each current sensor 255 simultaneously, whereas in other embodiments, power can be selectively supplied to each of the individual current sensors 255.

Figure 9:
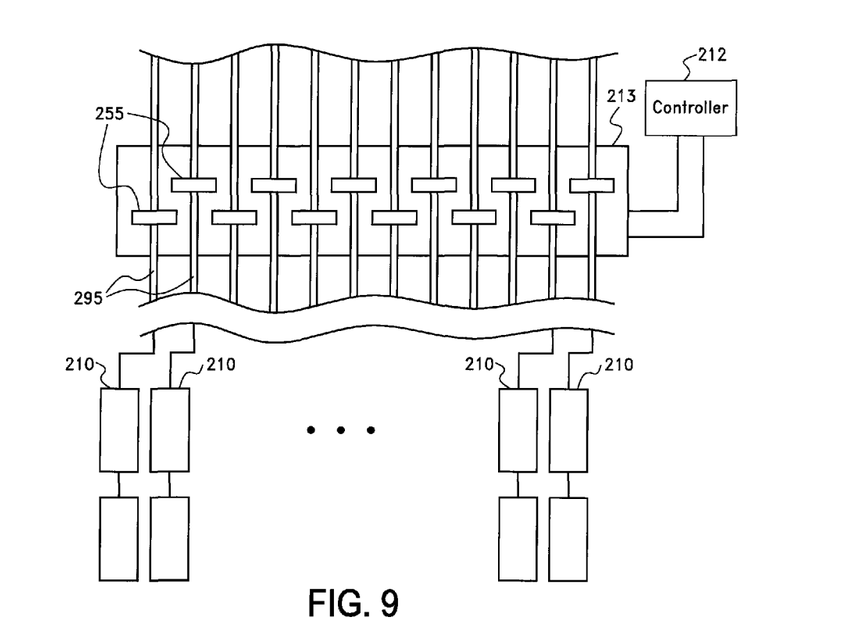
FIG. 9 schematically shows a plurality of strings of solar panels and a string current monitor block in accordance with an embodiment of the present invention.

FIG. 9 illustrates an embodiment of the sensor 213 coupled to the controller 212. The sensor 213 is positioned such that wires 295 from each string of solar panels 210 passes through a current sensor 255. As shown, twelve current sensors 255 can be used with twelve strings of solar panels 210, where each string of solar panels 210 is combined in a combiner box. By powering the sensor 213 from a communications port, the sensor 213 can simultaneously determine the current through each of twelve strings of solar panels 210, increasing the ease of automation of IV curve generation. Moreover, because the power used to operate the sensor 213 can come from a communications line connected to one or more of the communications ports 270, a separate power line from either a PV string or the controller 212 is not necessary. In this way, multiple sensors can be powered from a single communications and control device, such as the controller 212.

Figure 10:
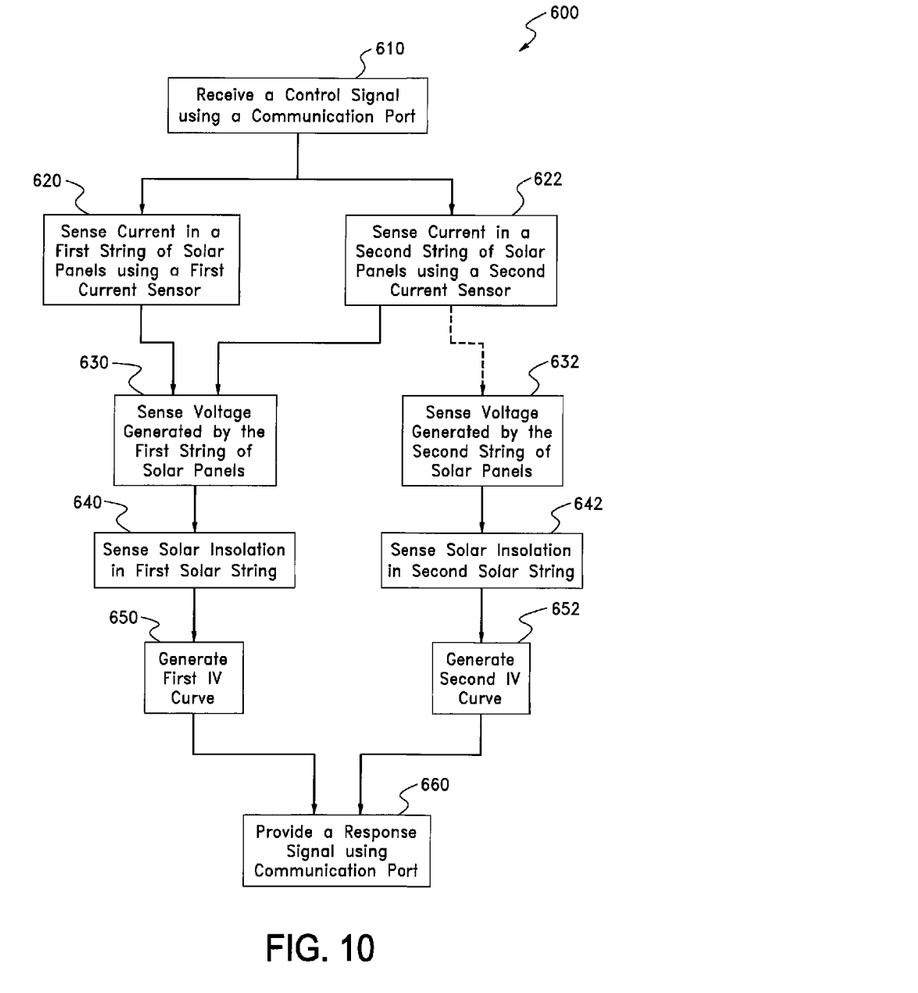
FIG. 10 shows a flow diagram of a method of automatic generation of solar cell IV curves in accordance with an embodiment of the present invention.

FIG. 10 illustrates a flowchart of a method for using a sensor, such as sensor 213, to automatically generate IV curves. The various tasks performed in connection with process 600 may be performed by software, hardware, firmware, or any combination thereof. For illustrative purposes, the following description of process 600 may refer to elements mentioned above in connection with FIGS. 6-9. In practice, portions of process 600 may be performed by different elements of the described system, e.g., current sensor 255, microcontroller 260, or communications port 270. It should be appreciated that process 260 may include any number of additional or alternative tasks, the tasks shown in FIG. 10 need not be performed in the illustrated order, and process 600 may be incorporated into a more comprehensive procedure or process having additional functionality not described in detail herein.

One method of using a sensor, such as sensor 213 described above with reference to FIGS. 6-9 can be in response to receiving 610 a control signal using or with a communications port 270 of the sensor 213. In response, the microcontroller 260 or other control device can operate at least a first 620 and second 622 current sensor to sense the current in respective first and second strings of solar panels, or solar strings. In certain embodiments, the first and second current sensors 255 can be powered by power received through the communications port 270 of the sensor 213.

In some embodiments, it may be sufficient to determine only the IV curve of the first string of solar panels. In such an embodiment, the voltage of the first string of solar panels can also be measured 630. The solar insolation of the first string of solar panels can additionally be determined. From this information, a first IV curve can be determined 650 and communicated 660 via a response signal using the communications port 270. In certain embodiments, the IV curve need not be determined, and all sensed information can be directly reported, such as current information from the sensor 213, to a controller, including the controller 212, and the IV curve determined remotely.

In certain embodiments, after performing current sensing steps 620, 622, the second string of solar panels can have its voltage sensed 632 and solar insolation sensed 642 independently from the first solar string. This information can be used to generate 652 a second IV curve independent from the first IV curve. In such embodiments, the IV curves can be reported together in step 660. In some embodiments, however, the sensed information from each or any of steps 622, 632, and/or 642 can be provided via a communications signal to the controller 212. In this way, the sensor 213 can either provide the IV curve directly or information which can be coordinated with other inputs, such as the voltage and/or solar insolation information to determine an IV curve.

Methods and apparatus for automatic generation and analysis of solar cell IV curves have been disclosed. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of automatically generating and analyzing solar cell current-voltage (IV) curves, the method comprising:
    varying a DC load presented to a first string of solar panels in a plurality of strings of solar panels, each string of solar panels in the plurality of strings of solar panels comprising a plurality of serially-connected solar panels, each solar panel in the plurality of serially-connected solar panels comprising a plurality of serially-connected solar cells mounted on a same frame;
    sensing voltages and currents generated by the first string of solar panels responsive to the variation of the DC load; and
    receiving data indicative of an environmental parameter; and
    a computer automatically generating a first IV curve of the first string of solar panels by plotting the voltages and currents generated by the first string of solar panels responsive to the variation of the DC load.

2. The method of claim 1 wherein the plurality of strings of solar panels is coupled to a device that presents the DC load to the plurality of strings of solar panels, and the voltages generated by the first string of solar panels responsive to the variation of the DC load are sensed at the device.

3. The method of claim 1 further comprising:
    evaluating performance of the first string of solar panels by comparing the first IV curve to another IV curve.

4. The method of claim 1 further comprising:
    analyzing the first IV curve to detect a failure in the first string of solar panels.

5. The method of claim 4 wherein the failure is an open circuit condition.

6. The method of claim 4 wherein the failure is a short circuit condition.

7. The method of claim 1 further comprising:
    automatically generating a second IV curve of the first string of solar panels, the second IV curve indicating voltages and currents generated by the first string of solar panels over a period of time.

8. The method of claim 7 further comprising:
    detecting performance degradation trends of the first string of solar panels by comparing the first IV curve to the second IV curve.

9. The method of claim 1 further comprising:
    sensing currents generated by a second string of solar panels in the plurality of strings of solar panels;
    sensing voltages generated by the second string of solar panels; and
    automatically generating a third IV curve of the second string of solar panels in the plurality of strings of solar panels, the third IV curve indicating voltages and currents generated by the second string of solar panels over a period of time.

10. A photovoltaic system comprising:
    a plurality of strings of solar panels, each string of solar panels in the plurality of strings of solar panels comprising a plurality of serially-connected solar panels, each solar panel in the plurality of serially-connected solar panels comprising a plurality of serially-connected solar cells mounted on a same frame;
    a current sensor circuit in each string of solar panels in the plurality of strings of solar panels; and
    a computer configured to:
        receive sensor data from the current sensor circuit in each string of solar panels in the plurality of strings of solar panels,
        receive environmental data, and
        generate a current-voltage (IV) curve of a first string of solar panels in the plurality of solar panels by plotting currents and voltages generated by the first string of solar panels responsive to variation of a DC load presented to the first string of solar panels over a first period of time.

11. The photovoltaic system of claim 10 further comprising:
    a device presenting the DC load to the plurality of strings of solar panels.

12. The photovoltaic system of claim 11 wherein the device comprises a photovoltaic inverter.

13. The photovoltaic system of claim 10 wherein the computer is further configured to generate a second IV curve of the first string of solar panels, and to compare the first IV curve to the second IV curve to detect performance degradation of the first string of solar panels.

14. The photovoltaic system of claim 10 wherein the computer is further configured to generate a third IV curve of a second string of solar panels in the plurality of strings of solar panels.

15. The photovoltaic system of claim 10 wherein the computer is further configured to compare the first IV curve to another IV curve to evaluate performance of the first string of solar panels.

16. A method of automatically generating and analyzing solar cell current-voltage (IV) curves, the method comprising:
   controlling a device to vary a DC load presented to a plurality of strings of solar panels;
   sensing currents and voltages generated by a first string of solar panels in the plurality of strings of solar panels responsive to the variation of the DC load; and
   generating a first IV curve of the first string of solar panels by plotting the currents and voltages generated by the first string of solar panels responsive to the variation of the DC load.

17. The method of claim 16 wherein the device comprises a photovoltaic inverter.

18. The method of claim 16 further comprising:
   comparing the first IV curve to another IV curve to evaluate performance of the first string of solar panels.

19. The method of claim 16 further comprising:
   generating a second IV curve of a second string of solar panels in the plurality of strings of solar panels; and
   analyzing the second IV curve to detect a problem with the second string of solar panels.

20. The method of claim 1, further comprising:
   filtering at least some data that includes the voltages and currents generated by the first string of solar panels responsive to the variation of the DC load based on the environmental parameter.

* * * * *